United States Patent [19]

Maxner

[11] Patent Number: 4,542,820
[45] Date of Patent: Sep. 24, 1985

[54] CONVEYOR FOR A SUBSTRATE

[75] Inventor: Richard B. Maxner, Danvers, Mass.

[73] Assignee: USM Corporation, Farmington, Conn.

[21] Appl. No.: 545,671

[22] Filed: Oct. 28, 1983

[51] Int. Cl.[4] .................. B65G 15/10; B65G 21/20
[52] U.S. Cl. .................................. 198/817; 198/626; 198/836
[58] Field of Search .................. 198/817, 626, 836

[56] References Cited

U.S. PATENT DOCUMENTS

| | | | |
|---|---|---|---|
| 3,101,836 | 8/1963 | Roundtree, Jr. | 198/626 |
| 3,108,682 | 10/1963 | Zipper | 198/626 |
| 3,133,496 | 5/1964 | Dubuit | 198/817 |
| 3,608,696 | 9/1971 | Lagermasini et al. | 198/626 |
| 3,840,111 | 10/1974 | Randrup | 198/817 |
| 3,848,864 | 11/1974 | Dwyer et al. | 198/626 |
| 3,931,881 | 1/1976 | Bickel et al. | 198/817 |
| 4,290,734 | 9/1981 | Van Breen | 198/626 |
| 4,422,541 | 12/1983 | Lisec | 198/817 |

OTHER PUBLICATIONS

IBM Technical Disclosure Bulletin, "Conveyor Belt", vol. 8, No. 6, p. 896, 11-1965.
Western Electric Technical Digest, "Flexible Wire Turnover Conveyor", No. 26, p. 11, 4-1972.

Primary Examiner—Joseph E. Valenza
Assistant Examiner—Daniel R. Alexander
Attorney, Agent, or Firm—Alan N. McCartney

[57] ABSTRACT

A conveyor for supporting a substrate having a substrate support guided in a track for linear movement, the support being the sole support for transporting the substrate.

2 Claims, 2 Drawing Figures

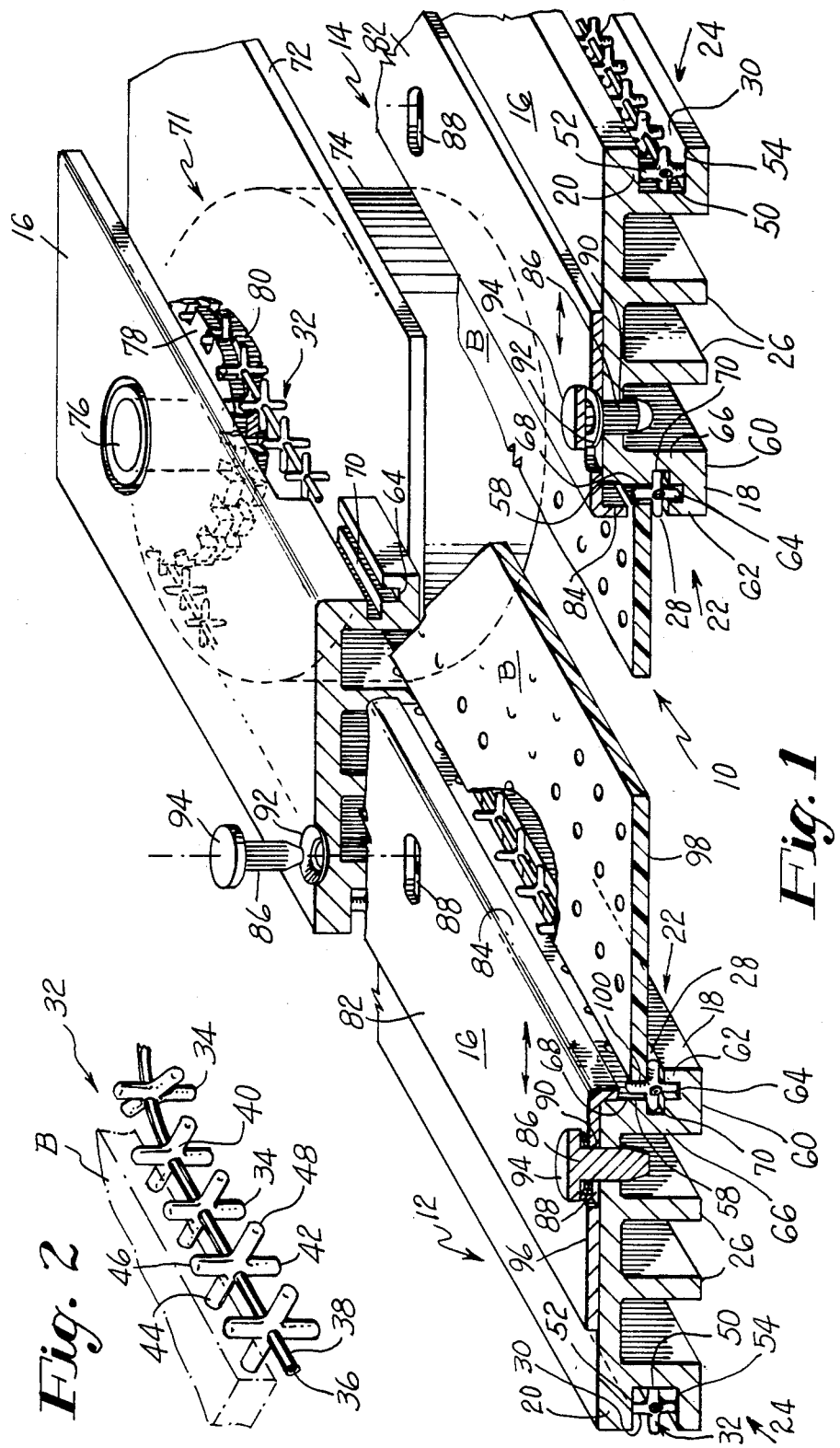

CONVEYOR FOR A SUBSTRATE

BACKGROUND OF THE INVENTION (1) Field of the Invention

This invention relates to a conveyor for substrates or substrate carriers for transporting printed circuit boards.

(2) Prior Art

In the art of machines for automatically placing electronic components on printed circuit boards, it is desirable to provide a mechanism for automatically handling the boards. Devices of this type are illustrated in U.S. Pat. Nos. 3,772,062, 3,808,662, 4,209,898, 4,274,529 and 4,283,847. It is desirable to control the rate of travel of the board or substrate or substrate carrier while being conveyed or transported to and from the assembly machine. This can best be accomplished by having the board or substrate only in contact with the moving parts of the board handling conveyor.

BRIEF SUMMARY OF THE INVENTION

It is an object of this invention to provide a conveyor having a transport means that substantially confines a printed circuit board so that the board is only in contact with the moving parts of the conveyor.

It is a further object of this invention to provide a conveyor for a substrate that confines the side edges of the substrate and transports the substrate free from frictional drag.

It is an additional object of this invention to have a conveyor for a substrate that includes a conveyor having a transport means that confines the side edges of the substrate and contacts the lower surface of the substrates for movement with the transport means. The transport means is in the form of a flexible member held within a support track in an axial plane to assure contact of the flexible member with the side edges and lower surface of the substrate.

It is an additional object of this invention to provide a conveyor for transporting a substrate in a lineal direction by means of a pair of substantially parallel tracks, each of which have guide means on their opposite sides. A movable substrate support means is carried in the guide means. The support means has angularly disposed projections received in the guide means to constrain the support means in a direction axial to the lineal direction of travel. The support also has angularly disposed projections extending beyond the surface of the tracks that contact the side and lower edges of the substrate to support the substrate. In this manner, only the moving portions of the conveyor contact the substrate so that the movement of the substrate is controlled and the substrate is free from any frictional contact with other stationary portions of the conveyor guide means.

The conveyor of this invention can be used to transport either a printed circuit board or a carrier upon which the board may be held for handling and assembly.

BRIEF DESCRIPTION OF THE DRAWINGS

FIG. 1 is perspective view, partially broken away, of the conveyor of this invention, and FIG. 2 is an enlarged perspective view of the substrate support means of the conveyor.

DESCRIPTION OF THE PREFERRED EMBODIMENT

In the assembly of components to printed circuit boards, apparatus can be used to automatically transport the boards from a storage magazine, place the board on an assembly table, remove the assembled board from the table and place the board back into the storage magazine. An apparatus of this type is disclosed in U.S. patent application Ser. No. 544,734 filed Oct. 24, 1983. In such an apparatus, it is necessary to transport the board linearly from the storage means to the assembly machine. It is desirable to transport the board by the side and lower edges to eliminate any contact between the board surface and stationary members of the conveyor.

The linear movement of the board is by a conveyor having a support means that physically supports and confines the side peripheral edges of the board. The board is only in contact with the moving conveyor board support members. This assures that there is no drag on any portions of the board which would alter the velocity at which the board moves or damage the side edges or surface of the board.

Attention is now directed to FIG. 1 which illustrates the conveyor 10 having track members 12 and 14 adapted to be mounted in substantially parallel relation on a support of any desired type (not shown). Each of the track members 12, 14 comprise an inverted U-shaped main support portion having a top 16 and downwardly extending opposed side portions 18 and 20. The track members 12, 14 are identical, except reversed, so that the inboard sides 22 and outboard sides 24, respectively, are the same in configuration. Further, a plurality of strengthening ribs 26 extend downwardly from the top 16 of the track members 12, 14 between the side portions 18 and 20.

The side portions 18 and 20 each contain guide means in the form of opposed outwardly extending grooves 28, 30 which receive the support means 32 for the transport of the substrate (in the illustration disclosed, a printed circuit board B). The support means 32 comprises of plurality of support members 34 flexibly, interconnected to form a continuous belt positioned in the guide means 28, 30 of the track members 12, 14.

Attention is directed to FIG. 2 which illustrates the support means in detail. The support means 32 has a flexible inner core 36 formed of flexible wire around which the support members 34 are molded. The support members 34 are interconnected by a molded sleeve 38 surrounding the core 36. The support members 34 and intergral sleeve 38 are formed of a synthetic flexible material. The support members 34 are cross-shaped and contain a main body portion 40 which surrounds the core 36 and a plurality of angularly disposed projections 42, 44, 46 and 48.

The outboard grooves 30 are substantially U-shaped and have a depth substantially equal to the width of the support members 34 and height substantially equal to the height of the support members 34, as illustrated in FIG. 1 of the drawing. In this fashion either the projection 44 or 48 on the body portion 40 of members 34 rests against the back 50 of the groove 30. Further, the projections 42 and 46 rest on the top 52 and bottom 54 of the groove to retain the members in the groove for movement in a direction axial to the direction of the lineal travel of the conveyor.

The inboard grooves 28 are a slightly different configuration. The side portions 18 are recessed at 58 from the outward edge 60 of the side portion 18. This forms a shelf 62 having a U-shaped central recess 64. The inboard side 66 of the recess 58 also has a face portion 68 with a U-shaped recess 70. When the support members 34 are positioned in the grooves 28, the projection 42 is received in the recess 64 with the projections 44 and 48 resting on shelf 62. Further, either the projection 44 or 48 extends into the recess 70 in face portion 68, with the projections 42 and 46 resting against the face portion 68. This interrelationship of the mounting of members 34 in the inboard grooves 28 also axially confines the support members 34 so that they do not loose position along the run of the grooves 28.

A drive mechanism 71 is provided for the support means 32. This drive mechanism is located at one end of the track members 12,14 and is illustrated in FIG. 1. A mounting plate 72 attached to track member 12 carries a motor 74 having a drive shaft 76 mounting a sprocket 78. The sprocket 78 has teeth 80 intermeshing with the individual support members 34 to positively drive the support means 32. In the particular embodiment illustrated, each of the track members 12 and 14 carry a drive mechanism 71 and the opposite end of the track members (not shown) would have a corresponding freely rotatable sprocket intermeshed with the individual support members 34 to provide a positive control over the travel of the support means 34.

A guide plate 82 is positioned on the top 16 of each track member 12 and 14 and has a downwardly extending projection 84 terminating above the shelf 62 and the surface of the board B as illustrated in FIG. 1. The plate 82 is secured to the track members 12, 14 by means of fasteners 86 passing through slotted openings 88 in the plate and received in openings 90 in the top 16 of the track. A resilient washer 92 is positioned between the head 94 of fastener 86 and the surface 96 of the plate 82 to retain the plate in position. The plate portion 84 is adapted to be positioned above the surface of the board B and will prevent upward movement of the board if it tends to flutter while traveling on the support means 32. If is desirable to remove the board B from the support means 32, then a slight pressure against the plate 82 will slide the plate against the force of the washer 92 to move the downwardly extending portion 84 away from the board surface, as shown on track 12 in FIG. 1.

The track members 12, 14 would be mounted to their support (not shown) in some manner convenient to adjust the space between the track members to accommodate different widths of boards. The space between the track members 12, 14 would thus be preset for a given width of board (B) so that the lower edge 98 of the board would rest on either the projection 44 or the projection 48 and the periferial edges 100 of the board would be in contact with the projection 46 so that the board would be substantially physically confined by the conveyor and only in contact with moving parts of the conveyor. This assures maximum control over the travel of the board so that the board location is properly timed to the other sequences of a machine in which such a conveyor would be utilized, much as an automatic printed circuit board handling mechanism.

I claim:

1. A conveyor for transporting a substrate free from contact with any stationary portions of the conveyor, comprising:
   a. a pair of substantially parallel track members extending from end to end of the conveyor, each of said track members having inwardly facing side members and outwardly facing side members;
   b. said inwardly facing side members each having guide means which contain a recess with support shelves separated by a downwardly extending longitudinal recess;
   c. said outwardly facing side members each having a U-shaped recess;
   d. a substrate support means received in said recess of said guide means and said U-shaped recess and comprising a plurality of flexibly interconnected members having projections forming cross shaped opposed horizontal and vertical legs;
   e. the legs of said projections being received in said guide means so that the opposed horizontal legs rest on said support shelves with the intermediate vertical leg positioned in said longitudinal recess to interfit said support means in said guide means;
   f. one pair of adjacent horizontal and vertical legs of said projections being adapted to support the side edges and lower edges only of the substrate so that the substrate is only supported by said projections; and
   g. guide plates secured to said track members adjacent said inwardly facing side members, said guide plates each having downwardly extending projections adapted to over lie the side edges of the substrate to permit limited upward movement only of the substrate.

2. The conveyor of claim 1 wherein said guide plates are adjustably positioned on said track members so that said guide plate projections can be spaced from the side edges of the substrate to permit removal of the substrate from the conveyor.

* * * * *